(12) United States Patent
Tang et al.

(10) Patent No.: US 8,963,333 B2
(45) Date of Patent: Feb. 24, 2015

(54) APPARATUS, SYSTEM, AND METHOD FOR WIRELESS CONNECTION IN INTEGRATED CIRCUIT PACKAGES

(71) Applicant: Intel Corporation, Santa Clara, CA (US)

(72) Inventors: Jiamiao Tang, Shanghai (CN); Henry Xu, Shanghai (CN); Shinichi Sakamoto, Ibaraki (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/970,053

(22) Filed: Aug. 19, 2013

(65) Prior Publication Data

US 2013/0334707 A1 Dec. 19, 2013

Related U.S. Application Data

(60) Continuation of application No. 13/335,825, filed on Dec. 22, 2011, now Pat. No. 8,513,108, which is a division of application No. 12/305,965, filed as application No. PCT/CN2006/001507 on Jun. 29, 2006, now Pat. No. 8,084,867.

(51) Int. Cl.
*H01L 23/522* (2006.01)
*H01L 23/00* (2006.01)
*H01L 25/065* (2006.01)

(52) U.S. Cl.
CPC ............ *H01L 23/5226* (2013.01); *H01L 24/24* (2013.01); *H01L 24/25* (2013.01); *H01L 24/82* (2013.01); *H01L 24/97* (2013.01);

(Continued)

(58) Field of Classification Search
CPC ..... H01L 23/5226; H01L 24/24; H01L 24/25; H01L 24/82; H01L 24/97; H01L 25/0657
USPC ................. 257/773, 774, E23.023, E21.506; 438/612, 672
See application file for complete search history.

(56) References Cited

U.S. PATENT DOCUMENTS

| 4,288,841 A | 9/1981 | Gogal |
| 5,311,402 A | 5/1994 | Kobayashi et al. |

(Continued)

FOREIGN PATENT DOCUMENTS

CN 1381889 11/2002

OTHER PUBLICATIONS

"U.S. Appl. No. 12/305,965, Non Final Office Action mailed Apr. 27, 2011", 8 pgs.

(Continued)

*Primary Examiner* — Allan R Wilson
(74) *Attorney, Agent, or Firm* — Schwegman Lundberg & Woessner, P.A.

(57) ABSTRACT

Some embodiments of the invention include a connecting structure between a support and at least one die attached to the support. The die includes a number of die bond pads on a surface of the die. The connecting structure includes a plurality of via and groove combinations. Conductive material is formed in the via and groove combinations to provide connection between the die bond pads and bond pads on the support. Other embodiments are described and claimed.

19 Claims, 9 Drawing Sheets

(52) U.S. Cl.
CPC ... *H01L25/0657* (2013.01); *H01L 2224/24011* (2013.01); *H01L 2224/24051* (2013.01); *H01L 2224/24145* (2013.01); *H01L 2224/24226* (2013.01); *H01L 2224/24998* (2013.01); *H01L 2224/32145* (2013.01); *H01L 2224/82039* (2013.01); *H01L 2224/82047* (2013.01); *H01L 2224/97* (2013.01); *H01L 2225/06524* (2013.01); *H01L 2225/06551* (2013.01); *H01L 2225/06582* (2013.01); *H01L 2924/01002* (2013.01); *H01L 2924/01005* (2013.01); *H01L 2924/01029* (2013.01); *H01L 2924/01033* (2013.01); *H01L 2924/01047* (2013.01); *H01L 2924/01079* (2013.01); *H01L 2924/14* (2013.01); *H01L 2924/1433* (2013.01); *H01L 2924/30105* (2013.01); *H01L 2924/30107* (2013.01); *H01L 2924/01006* (2013.01); *H01L 2924/014* (2013.01); *H01L 2224/82007* (2013.01); *H01L 2224/45147* (2013.01); *H01L 2224/32225* (2013.01); *H01L 2224/92244* (2013.01); *H01L 2224/45144* (2013.01); *H01L 2224/73267* (2013.01); *H01L 2924/00014* (2013.01); *H01L 2225/06568* (2013.01)
USPC ............ 257/773; 257/774; 257/E23.023; 257/E21.506; 438/612; 438/672

(56) References Cited

U.S. PATENT DOCUMENTS

| | | | |
|---|---|---|---|
| 5,571,754 A | 11/1996 | Bertin et al. | |
| 5,648,684 A | 7/1997 | Bertin et al. | |
| 5,994,781 A | 11/1999 | Smith | |
| 6,326,244 B1 | 12/2001 | Brooks et al. | |
| 6,379,999 B1 | 4/2002 | Tanabe | |
| 6,492,719 B2 * | 12/2002 | Miyamoto et al. | 257/686 |
| 6,506,633 B1 | 1/2003 | Cheng et al. | |
| 6,787,915 B2 | 9/2004 | Uchida et al. | |
| 6,787,916 B2 * | 9/2004 | Halahan | 257/777 |
| 6,865,084 B2 | 3/2005 | Lin et al. | |
| 6,905,914 B1 | 6/2005 | Huemoeller et al. | |
| 7,084,513 B2 | 8/2006 | Matsuki et al. | |
| 7,138,722 B2 * | 11/2006 | Miyamoto et al. | 257/777 |
| 7,192,807 B1 | 3/2007 | Huemoeller et al. | |
| 7,361,533 B1 | 4/2008 | Huemoeller et al. | |
| 7,371,975 B2 | 5/2008 | Dory et al. | |
| 7,531,441 B2 * | 5/2009 | Kado et al. | 438/612 |
| 7,547,965 B2 | 6/2009 | Hsu | |
| 8,084,867 B2 | 12/2011 | Tang et al. | |
| 8,178,901 B2 | 5/2012 | Gamand et al. | |
| 8,513,108 B2 | 8/2013 | Tang et al. | |
| 2002/0149097 A1 * | 10/2002 | Lee et al. | 257/686 |
| 2003/0209740 A1 * | 11/2003 | Miyamoto et al. | 257/286 |
| 2004/0048459 A1 | 3/2004 | Patti | |
| 2004/0118604 A1 | 6/2004 | Dory et al. | |
| 2004/0164404 A1 | 8/2004 | Huang | |
| 2005/0001329 A1 | 1/2005 | Matsuki et al. | |
| 2005/0140006 A1 | 6/2005 | Takahashi | |
| 2005/0167812 A1 * | 8/2005 | Yoshida et al. | 257/686 |
| 2005/0245060 A1 * | 11/2005 | Chiu | 438/612 |
| 2006/0043570 A1 | 3/2006 | Muramatsu et al. | |
| 2008/0169548 A1 | 7/2008 | Baek | |
| 2009/0267211 A1 | 10/2009 | Chung et al. | |
| 2010/0244268 A1 | 9/2010 | Tang et al. | |
| 2012/0108053 A1 | 5/2012 | Tang et al. | |
| 2012/0119263 A1 * | 5/2012 | Chua et al. | 257/208 |
| 2014/0042639 A1 | 2/2014 | Tang et al. | |

OTHER PUBLICATIONS

"U.S. Appl. No. 12/305,965, Notice of Allowance mailed Aug. 25, 2011", 6 pgs.
"U.S. Appl. No. 12/305,965, Preliminary Amendment filed Dec. 20, 2008", 3 pgs.
"U.S. Appl. No. 12/305,965, Response filed Apr. 8, 2011 to Restriction Requirement mailed Mar. 9, 2011", 6 pgs.
"U.S. Appl. No. 12/305,965, Response filed Jul. 27, 2011 to Non Final Office Action mailed Apr. 27, 2011", 12 pgs.
"U.S. Appl. No. 12/305,965, Restriction Requirement mailed Mar. 9, 2011", 6 pgs.
"U.S. Appl. No. 13/335,825, Non Final Office Action mailed Oct. 4, 2012", 11 pgs.
"U.S. Appl. No. 13/335,825, Notice of Allowance mailed Apr. 22, 2013", 6 pgs.
"U.S. Appl. No. 13/335,825, Preliminary Amendment filed Feb. 28, 2012", 3 pgs.
"U.S. Appl. No. 13/335,825, Response filed Mar. 4, 2013 to Non Final Office Action mailed Oct. 4, 2012", 10 pgs.
"U.S. Appl. No. 13/970,241, Final Office Action mailed Jul. 11, 2014", 11 pgs.
"U.S. Appl. No. 13/970,241, Non Final Office Action mailed Dec. 27, 2013", 6 pgs.
"U.S. Appl. No. 13/970,241, Response filed Jun. 27, 2014 to Non Final Office Action mailed Dec. 27, 2013", 7 pgs.
"Chinese Application Serial No. 200680054730.3, Office Action mailed Dec. 14, 2009, with English translation", 8 pgs.
"Chinese Application Serial No. 200680054730.3, Office Action mailed Apr. 7, 2011", with English translation, 7 pgs.
"Korean Application Serial No. 2008-7029352, Office Action mailed Sep. 15, 2010", 2 pgs.

\* cited by examiner

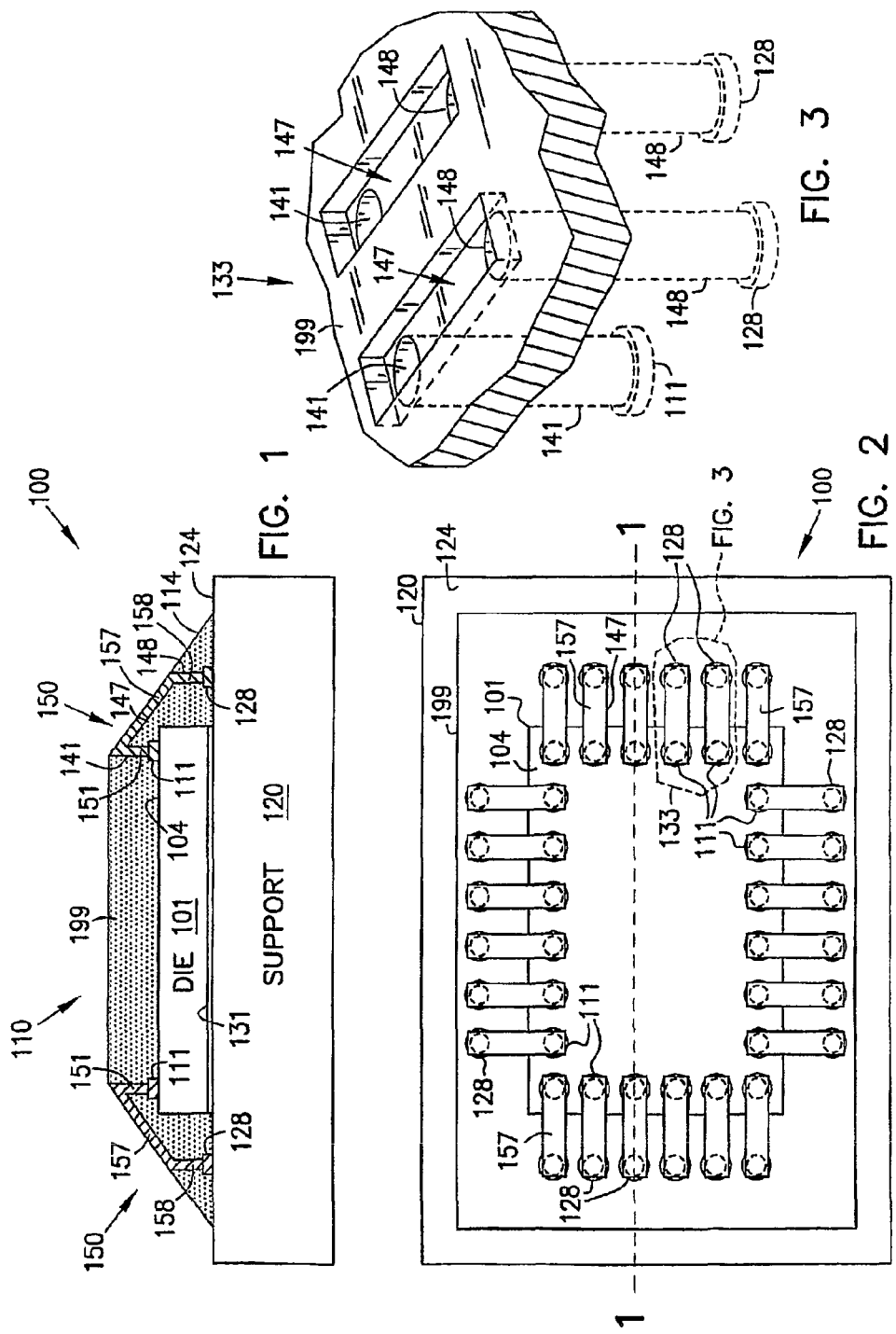

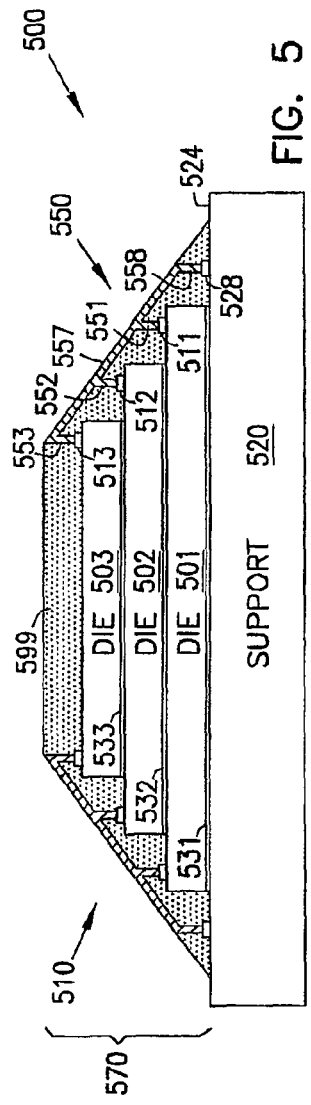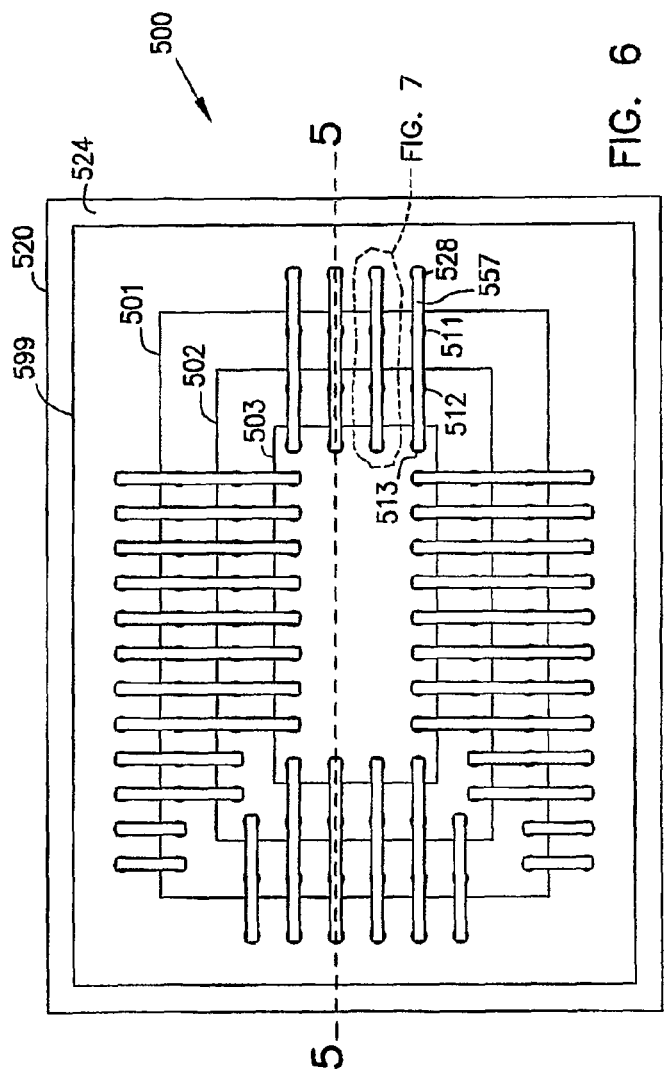

APPARATUS, SYSTEM, AND METHOD FOR WIRELESS CONNECTION IN INTEGRATED CIRCUIT PACKAGES

RELATED APPLICATION

This application is a continuation of U.S. application Ser. No. 13/335,825, filed Dec. 22, 2011, which is a divisional of U.S. application Ser. No. 12/305,965, filed Feb. 24, 2009, which is a U.S. National Stage Filing under 35 U.S.C. 371 from International Patent Application Ser. No. PCT/CN2006/001507, filed Jun. 29, 2006, and published on Feb. 7, 2008 as WO 2008/014633 A1, all of which are incorporated herein by reference in their entirety.

FIELD

Embodiments of the present invention relate to integrated circuit packaging, and particularly to wiring connections in integrated circuit packages.

BACKGROUND

Computers and electronic devices usually include an integrated circuit (IC) package. The IC package may often have a die mounted on a base or support of the IC package. The die may include a circuit for performing an electrical function.

Some IC packages have gold or copper wires coupled between the die and the support to allow electrical signal to be transferred to and from the circuit in the die.

In some cases, too many wires may cause undesirable signal interference, raise wiring material cost, increase package size to protect the wires, increase the chance of short circuit among the wires, and may complicate manufacturing process.

BRIEF DESCRIPTION OF DRAWINGS

FIG. 1 through FIG. 3 show an apparatus having a die with a connecting structure according to an embodiment of the invention.

FIG. 5 through FIG. 7 show an apparatus having a die stack with a connecting structure according to an embodiment of the invention.

DESCRIPTION OF EMBODIMENTS

Figure 4:
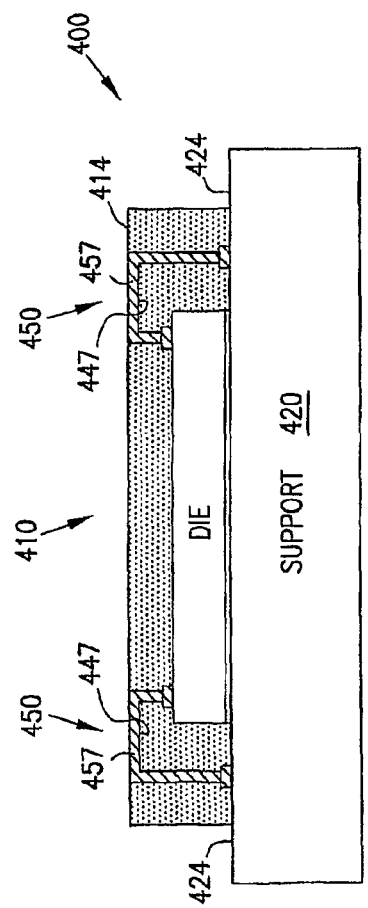
FIG. 4 shows an apparatus having a die with a connecting structure according another embodiment of the invention.

FIG. 1 through FIG. 3 show an apparatus 100 having a die 101 with a connecting structure 110 according to an embodiment of the invention. FIG. 1 shows a cross section of apparatus 100 based on a cross section along section line 1-1 of the top plan view of apparatus 100 shown in FIG. 2. FIG. 3 is a three-dimensional view of a portion of apparatus 100 showing detail of a via and groove combination. Die 101 of apparatus 100 in FIG. 1 and FIG. 2 may include a circuit for performing a function of a semiconductor device such as a processor, a memory device, a communication device, or some combination thereof. Apparatus 100 may be a part of an IC package. In some embodiments, apparatus 100 may reside in a system or in a device such a computer or a cellular phone. In FIG. 1, connecting structure 110 enables transfer of signals to and from die 101.

For clarity, some features described herein (e.g., die 101 in FIG. 1) may be depicted with solid lines instead of cross section line symbols (cross-hatch lines) when the features are shown in a cross section view. Also for clarity, some features described herein (e.g., die 101 in FIG. 2) may be depicted with solid line instead of hidden line symbols (broken lines) when the features are shown in a plan view. In FIG. 1, apparatus 100 includes an attachment 131, which attaches die 101 to a support 120. Attachment 131 may include an adhesive material. Support 120 may be a substrate of an IC package in which apparatus 100 may be located. As shown in FIG. 1 through FIG. 3, connecting structure 110 includes a dielectric layer 199 covering at least a portion of die 101, a via 141, a via 148, a groove 147, and a connection 150 having a conductive segment 151, conductive segment 158, and a conductive segment 157 bridging conductive segments 151 and 158.

FIG. 3 is a three-dimensional view of a portion 133 of apparatus 100 showing detail of a via and groove combination, which includes vias 141 and 148, and groove 147, before connection 150 in FIG. 1 is formed. After connection 150 is formed (FIG. 1), conductive material of connection 150 fills vias 141 and 148, and groove 147. In some embodiments, conductive material of connection 150 includes metal. Connection 150 couples a die bond pad 111 on a surface 104 of die 101 to support bond pad 128 on a surface 124 of support 120 to allow electrical signal to transfer between die bond pad 111 and support bond pad 128. Support bond pad 128 may couple to other components to allow transfer of signals between the circuit in die 101 and the other components.

As show in FIG. 2, die 101 includes a number of die bond pads 111 on surface 104 and support 120 includes a number of support bond pads 128 on surface 124. The number and the arrangement of die bond pads 111 and support bond pads 128 in FIG. 2 are shown as an example. In some embodiments, the number and the arrangement of die bond pads 111 and support bond pads 128 may be different from those in FIG. 2. For example, die 101 and support 120 may have bond pads on only two edges instead on all four edges as shown in FIG. 2.

FIG. 2 shows an example where the diameter of each of the die bond pads 111 and support bond pads 128 is greater than the diameter of each of the vias 141 and 148. In some embodiments, the diameter of each of the die bond pads 111 and support bond pad 128 may be smaller than or equal the diameter of each of the vias 141 and 148.

FIG. 1 shows a surface 114 of dielectric layer 199 being at an angle relative to surface 124 of support 120 such that groove 147 and conductive segments are also at an angle relative to surface 124 of support 120. In some embodiments, surface 114 of dielectric layer 199 may be substantially parallel to surface 124 of support 120 such that groove 147 and conductive segments are also substantially parallel to surface 124 of support 120.

FIG. 4 shows an apparatus 400 with a connecting structure 410 according to another embodiment of the invention. As shown in FIG. 4, connecting structure 410 includes a surface 414 substantially parallel to a surface 424 of support 420 such that groove 447 and conductive segment 457 of connection 450 are substantially parallel to surface 424 of support 420.

Figure 7:
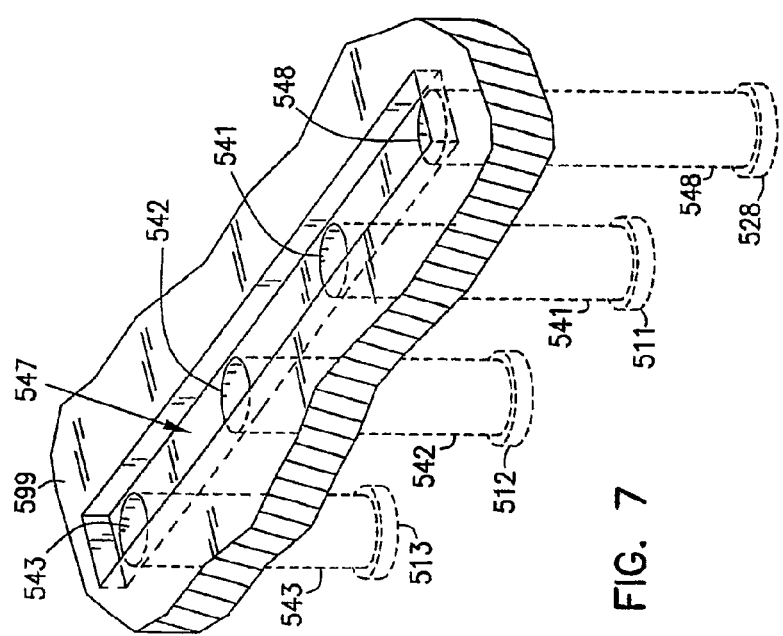

FIG. 5 through FIG. 7 show an apparatus 500 having a die stack 570 and a connecting structure 510 according to an embodiment of the invention. FIG. 5 shows a cross section of apparatus 500 based on a cross section along section line 5-5 of the top plan view of apparatus 500 shown in FIG. 6. FIG. 7 is a three-dimensional view of a portion of apparatus 500 showing detail of a via and groove combination. Apparatus 500 may be a part of an IC package.

As shown in FIG. 5, die stack 570 includes dice 501, 502, and 503 arranged in a stack on a support 520. Dice 501, 502, and 503 include corresponding die bond pads 511, 512, and 513. Attachments 531, 532, and 533 attach die 501, 502, and 503 to each other and to support 520. Connecting structure 510 includes a dielectric layer 599 covering at least a portion of dice 501, 502, and 503, a connection 550 including conductive segments 551, 552, 553, 557, and 558 coupled to die bond pads 511, 512, and 513 and to a support bond pad 528 on a surface 524 of support 520. Conductive segments 551, 552, 553, 557, and 558 are formed in a via and groove combination, which are shown in detail in FIG. 7. FIG. 7 shows a via and groove combination, which includes vias 541, 542, 543, and 548, and groove 547 before connection 550 in FIG. 5 is formed. After connection 550 is formed (FIG. 5) conductive material of connection 550 fills vias 541, 542, 543, and 548 to form conductive segments 551, 552, 553, and 558. The conductive material of connection 550 also fills groove 547 to form conductive segment 557, which bridges conductive segments 551, 552, 553, and 558. FIG. 5 shows an example where apparatus 500 includes three dice. In some embodiments, the number of dice of apparatus 500 may vary. For example, the number of dice of apparatus 500 may be two or more than three.

FIG. 8 through FIG. 14 show various processes of forming a connecting structure according to an embodiment of the invention.

Figure 8:
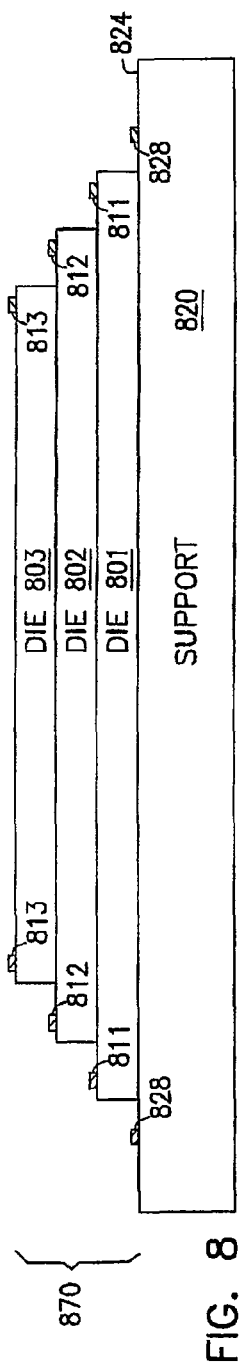
FIG. 8 through FIG. 14 show various processes of forming a connecting structure according to an embodiment of the invention.

FIG. 8 shows a die stack 870 having dice 801, 802, and 803 stacked on a support 820. Dice 801, 802, and 803 include corresponding die bond pads 811, 812, and 813. Support 820 includes support bond pad 828 on a support surface 824. Die stack 870 may include attachments (e.g. adhesive) between the dice and between the dice and support 820. The attachments are omitted from FIG. 8. In some embodiments, one or more of the dice 801, 802, and 803 may have an individual die thickness of less than 300 μm (micrometer). In some embodiments, the relatively small die thickness of dice 801, 802, and 803 may enhance the formation of the connecting structure according the description described herein.

Figure 9:
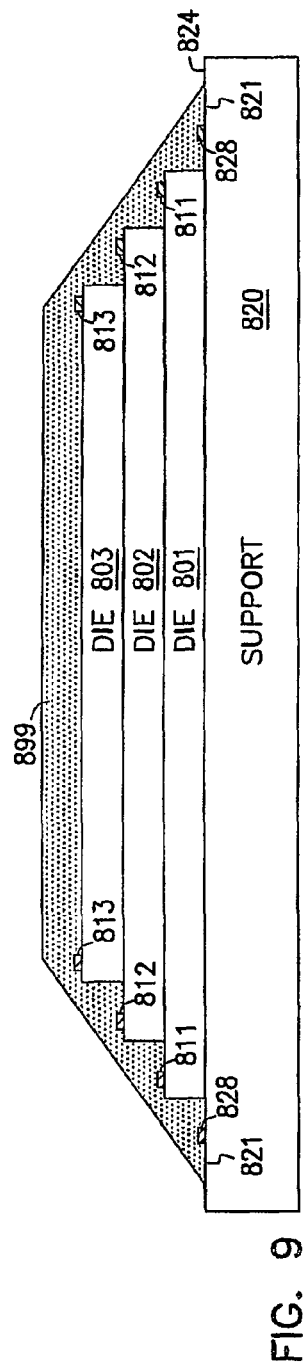

FIG. 9 shows a dielectric layer 899 formed on dice 801, 802, and 803 and on a surface portion 821 of support 820. As shown in FIG. 9, dielectric material 899 covers dice 801, 802, and 803, and support portion 821. Dielectric layer 899 may be formed by depositing a dielectric material on dice 801, 802, and 803 and on a support portion 821 of support 820. In some embodiments, depositing the dielectric material to form dielectric layer 899 may include coating dice 801, 802, and 803, and support portion 821 with the dielectric material. In other embodiments, depositing the dielectric material to form dielectric layer 899 may include molding dice 801, 802, and 803, and support portion 821 with the dielectric material. Other techniques may be used to form dielectric layer 899.

Figure 10:
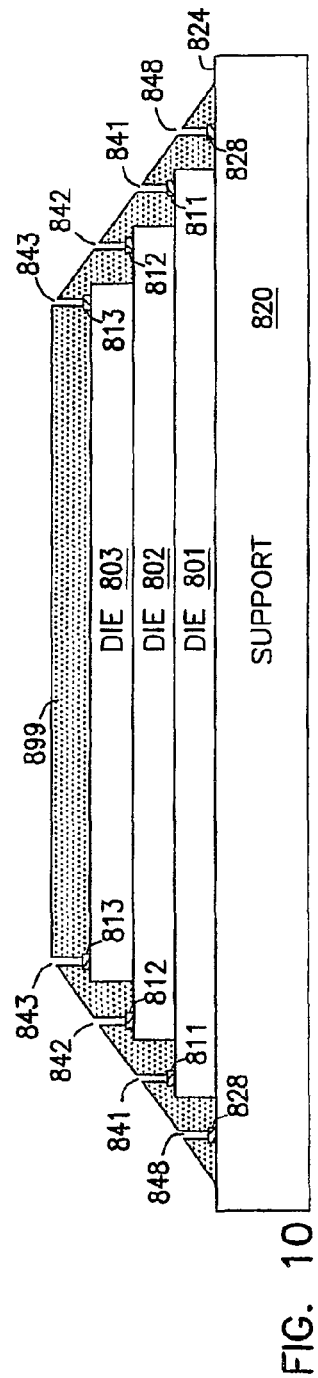

FIG. 10 shows a number of vias 841, 842, 843, and 848 formed in dielectric layer 899. Vias 841, 842, 843, and 848 are substantially perpendicular to substrate surface 824. As shown in FIG. 10, vias 841, 842, 843, and 848 are formed over die bond pads 811, 812, and 813, and support bond pad 828 to provide an access to each of the die bond pads 811, 812, and 813, and support bond pad 828. The access allows connection to die bond pads 811, 812, 813, and support bond pad 828 in a subsequent process. In some embodiments, vias 841, 842, 843, and 848 may be formed by applying a laser to dielectric layer 899. In other embodiments, vias 841, 842, 843, and 848 may be formed by mechanically drilling dielectric layer 899.

For example, drill bits may be used to drill dielectric layer 899 to form vias 841, 842, 843, and 848. In some other embodiments, lithography techniques may be used to remove (e.g., by etching) portions of dielectric layer 899 to form vias 841, 842, 843, and 848. Other techniques may be used to form vias 841, 842, 843, and 848.

Figure 11:
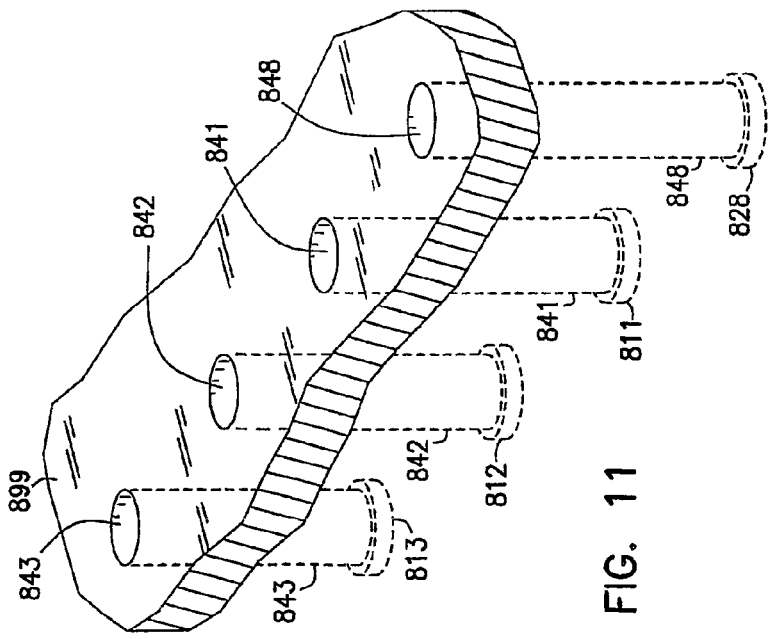

FIG. 11 is a three-dimensional view of a portion of dielectric layer 899 after vias 841, 842, 843, and 848 are formed.

Figure 12:
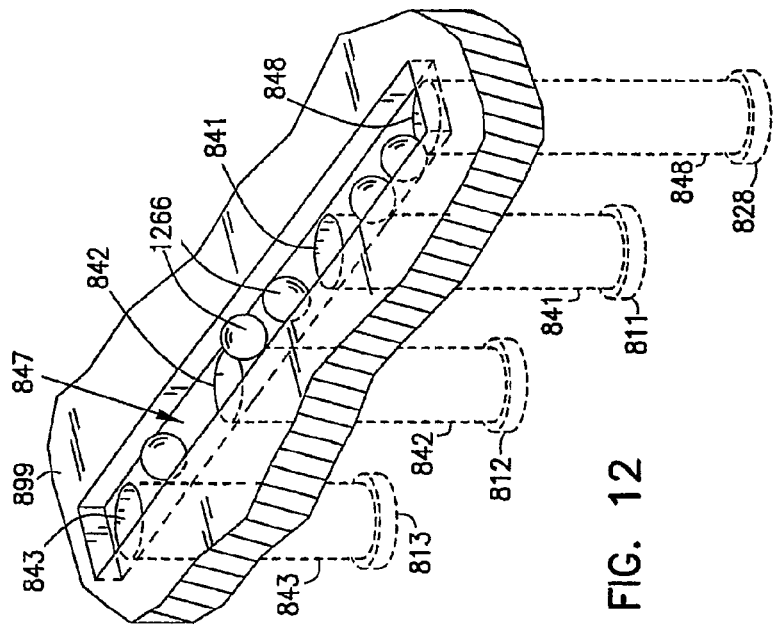

FIG. 12 shows groove 847 formed in dielectric layer 899 and over vias 841, 842, 843, and 848. Vias 841, 842, 843, and 848 and groove 847 form a via and groove combination. In some embodiments, groove 847 may be formed by applying a laser to dielectric layer 899. In other embodiments, groove 847 may be formed by mechanically drilling dielectric layer 899. For example, drill bits may be used to drill dielectric layer 899 to form groove 847. In some other embodiments, lithography techniques may be used to remove portions of dielectric layer 899 to form groove 847. Other techniques may be used to form groove 847.

FIG. 12 also shows an example where solder balls 1266 are introduced such that solder balls 1266 may be placed in groove 847, or in vias 841, 842, 843, and 848, or both in groove 847 and in vias 841, 842, 843, and 848. A subsequent process may melt solder balls 1266 so that solder balls 1266 may fill vias 841, 842, 843, and 848 and groove 847 to from a conductive connection. In some embodiments, instead of solder balls 1266, solder material with shape other than ball shape may be placed in groove 847. A subsequent process may melt the solder material so that the solder material may fill vias 841, 842, 843, and 848 and groove 847 to form a conductive connection.

In the processes described in FIG. 11 and FIG. 12, one or more of the following techniques may be used to form vias 841, 842, 843, and 848 and groove 847: laser, mechanical drilling, and lithography.

Figures 13, 14:
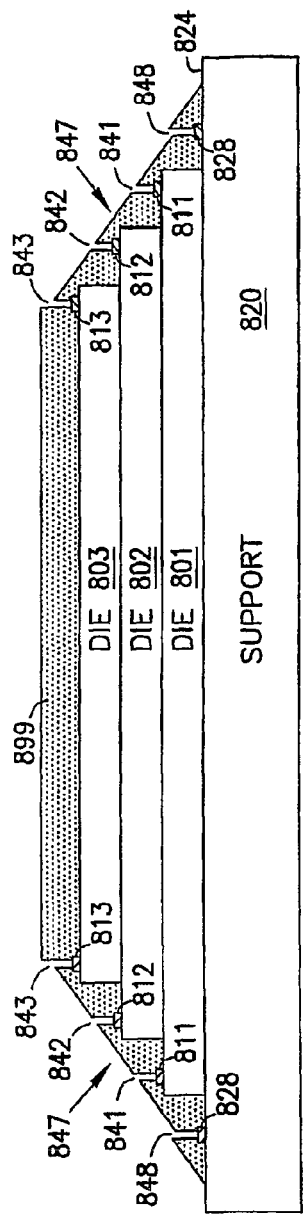

FIG. 13 shows dielectric layer 899 after the formation of vias 841, 842, 843, and 848 and groove 847.

FIG. 14 shows an apparatus 1400 having a connecting structure 1410. Connecting structure 1410 includes dielectric layer 899, and a connection 1450 coupling die bond pads 811, 812, 813 to support bond pad 828. In some embodiments, connection 1450 may be formed by placing solder balls, such as solder balls 1266 (FIG. 12), in groove 847 and vias 841, 842, 843, and 848, then melting solder balls 1266 so that solder balls 1266 may fill vias 841, 842, 843, and 848 and groove 847 to form connection 1450. In embodiments where solder balls are used to form connection 1450, flux may be used to treat groove 847 and vias 841, 842, 843, and 848 to improve solder wetting. In other embodiments, a conductive paste may be placed, printed, or pressed onto groove 847 and vias 841, 842, 843, and 848 to form connection 1450. A curing or baking of the conductive paste may be performed. The conductive paste may be a single material or a combination of two or more materials. For example, the conductive paste may be copper paste, a combination of tin and silver paste, solder paste, or other conductive paste materials. Other techniques may be used to fill groove 847 and vias 841, 842, 843, and 848 with a conductive material to form connection 1450. As shown in FIG. 14, connection 1450 includes conductive segments 1451, 1452, 1453, and 1458 formed inside vias 841, 842, 843, and 848 and coupled to die bond pads 811, 812, and 813, and support bond pad 828, and a conductive segment 1457 formed in groove 847, bridging conductive segments 1451, 1452, 1453, and 1458. Conductive segments 1451, 1452, 1453, and 1458 may be substantially perpendicular to support surface 824. Apparatus 1400 of FIG. 14 may be a part of an IC package.

As described in FIG. 8 through FIG. 14, since groove 847 and vias 841, 842, 843, and 848 are already formed (FIG. 13) before connection 1450 (FIG. 14) is formed, conductive segments 1451, 1452, 1453, 1458, and 1457 of connection 1450 may be formed in one process step (step from FIG. 13 to FIG. 14) by, for example, filling groove 847 and vias 841, 842, 843, and 848 with a conductive material at the same time. Forming conductive segments 1451, 1452, 1453, 1458, and 1457 in one process step or at the same time also means that connections between support bond pad 828 and each of the die bond pads 811, 812, and 813 are not formed in separate process steps. Therefore, manufacturing processes for connection between support 820 and dice 801, 802, and 803 may be simplified, or faster, or both, which may reduce processing cost. Further, as described and shown in FIG. 1 though FIG. 14, connections 150, 450, 550, and 1450 contain no wires (wireless) such as conventional wires connecting between a bond pad of a die and a support or substrate. Thus, material cost may also be reduced because the material (e.g., gold) of the wires in wired connections may be relatively higher than the material of the wireless connections such as connections 150, 450, 550, and 1450.

As described in FIG. 1 through FIG. 14 in apparatus 100, 400, 500, and 1400, since no wires are used for connections 150, 450, 550, and 1450, parasitic inductance, resistance, or, capacitance, or a combination of thereof, associated with wires, may be reduced. Thus, electrical performance of apparatus 100, 400, 500, or 1400 may be improved. Further, a connection such as connection 150, 450, 550, or 1450, as described in FIG. 1 through FIG. 14, may be relatively shorter than a connection with wires. Hence, in comparison with a wired connection, electrical signal delay in connection 150, 450, 550, or 1450 may be smaller, thereby signal speed in an IC package with apparatus 100, 400, 500, or 1400 may be relatively higher than in an IC package with wired connection. Moreover, since connections 150, 450, 550, or 1450, as described in FIG. 1 through FIG. 14, includes no wires, short circuit due to wires may be reduced. Therefore, in apparatus 100, 400, 500, or 1400, the yield, the quality, the reliability, or a combination thereof, may increase.

The processes described in FIG. 8 through FIG. 14 form a connecting structure (e.g., connecting structure 510 or 1410 of FIG. 5 or FIG. 14) between a stack of multiple dice and a support. In some embodiments, the processes described in FIG. 8 through FIG. 14 may be used to form a connecting structure between a single die and a support such as connecting structure 110 of FIG. 1 or connecting structure 410 of FIG. 4.

Figure 15:
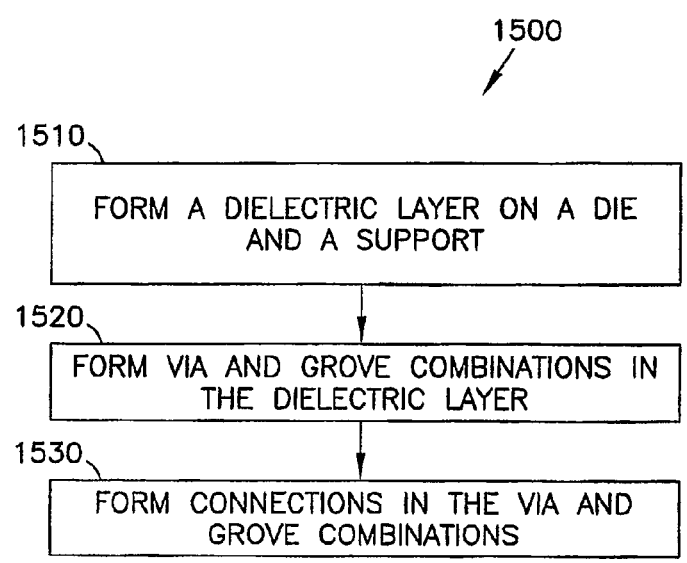
FIG. 15 is a flowchart showing a method according to an embodiment of the invention.

FIG. 15 is a flowchart showing a method 1500 according to an embodiment of the invention. Method 1500 forms a connecting structure between at least one die and a support attached to the die. Activity 1510 of method 1500 forms a dielectric layer on the die and the support. Activity 1520 forms via and groove combinations in the dielectric layer. Activity 1530 forms connections in the via and groove combinations. The connections couple die bond pads on the die with support bond pads on the support. The connecting structure formed by method 1500 may include the embodiments of connecting structures 110, 410, 510, and 1410 of FIG. 1 through FIG. 14. The activities of method 1500 may include the activities or processes described in FIG. 1 through FIG. 14. The individual activities of method 1500 do not have to be performed in the order shown or in any particular order. Some activities may be repeated, and others may occur only once. Various embodiments of the invention may have more or fewer activities than those shown in FIG. 15.

Figure 16:
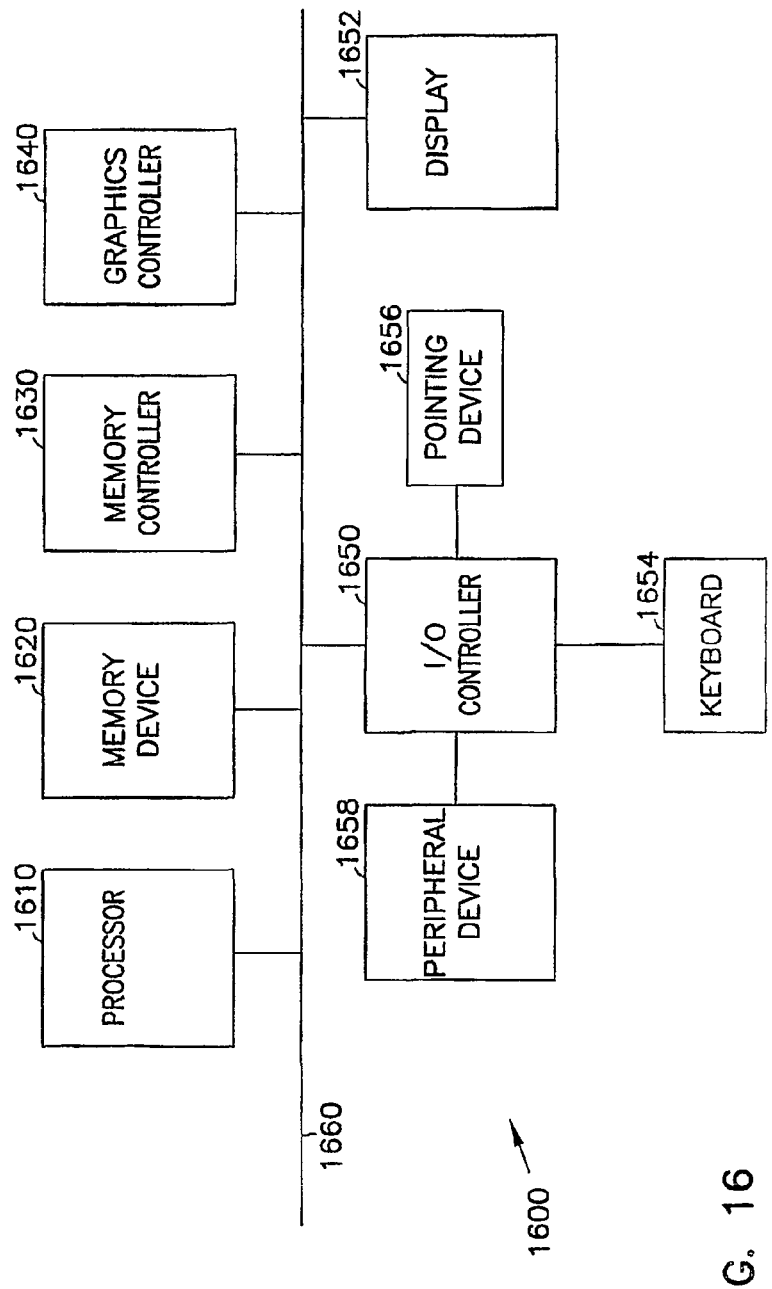
FIG. 16 shows a system according to an embodiment of the invention.

FIG. 16 shows a system according an embodiment of the invention. System 1600 includes a processor 1610, a memory device 1620, a memory controller 1630, a graphics controller 1640, an input and output (I/O) controller 1650, a display 1652, a keyboard 1654, a pointing device 1656, a peripheral device 1658, and a bus 1660.

Processor 1610 may be a general-purpose processor or an application specific integrated circuit (ASIC). Memory device 1620 may be a dynamic random access memory (DRAM) device, a static random access memory (SRAM) device, a flash memory device, or a combination of these memory devices. I/O controller 1650 may include a communication module for wired or wireless communication. One or more or the components shown in system 1600 may include an apparatus such as apparatus 100, 400, 500, or 1400 of FIG. 1 through FIG. 14. One or more or the components shown in system 1600 may be included in one or more IC packages. For example, processor 1610, or memory device 1620, or at least a portion of I/O controller 1650, or a combination of these components may be included in an IC package in which the IC package may include an apparatus such as apparatus 100, 400, 500, or 1400 of FIG. 1 through FIG. 14. Thus, one or more of the components shown in system 1600 may include a connecting structure such as connecting structure 110, 410, 510, or 1410 of FIG. 1 through FIG. 14.

System 1600 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The above description and the drawings illustrate some specific embodiments of the invention sufficiently to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments is determined by the appended claims, along with the full range of equivalents to which such claims are entitled.

What is claimed is:

1. An apparatus comprising:
    a support including a support surface and a support bond pad on the support surface;
    a first die including a first die surface and a first die bond pad on the first die surface, wherein the first die is disposed on the support;
    a connection coupled to the first die bond pad and the support bond pad;
    a second die arranged in a stack with the first die, the second die including a second die surface and a second die bond pad on the second die surface;
    a third die arranged in a stack with the first, and second dice, the third die including a third die surface and a third die bond pad on the third die surface, wherein each of the second and third dice are coupled with adhesive;
    a dielectric layer located outside the first die, the second die, and the third die, wherein the dielectric layer contacts the first die surface, the second die surface, the third die surface and the support surface, and the dielectric layer contacts the connection coupled to the first die bond pad and the support bond pad;

wherein the first die, the second die, and the third die include a processor, a memory device including a memory controller, and an I/O controller that includes a communication module for wireless communication.

2. The apparatus of claim 1, wherein the memory device is selected from a dynamic random-access memory (DRAM) and a static random-access memory (SRAM), a flash memory, and a combination of these memory devices.

3. The apparatus of claim 1, wherein the communication module for wireless communication is a cellular phone.

4. The apparatus of claim 1, wherein no wires are used for connections between the first die and the support.

5. The apparatus of claim 4, wherein connections between the first die and the support are done by melting solder balls to form a conductive connection.

6. The apparatus of claim 1, the apparatus further including:
 a first connection between the second die and the support;
 a second connection in contact with the second die and coupled to the support;
 a third connection in contact with the third die and coupled to the support.

7. The apparatus of claim 1, wherein no wires are used for connections between the first die and the support, the apparatus further including:
 a connection coupled between the second die and the support;
 a second connection in contact with the second die and coupled to the support; and
 a third connection in contact with the third die and coupled to the support.

8. The apparatus of claim 1, wherein the dielectric layer covers at least a portion of the first die surface and at least a portion of the support surface.

9. The apparatus of claim 1, wherein no wires are used for connections between the first die and the support, and wherein the dielectric layer covers at least a portion of the first die surface and at least a portion of the support surface the apparatus further including:
 a connection coupled between the second die and the support;
 a second connection in contact with the second die and coupled to the support; and
 a third connection in contact with the third die and coupled to the support.

10. An apparatus comprising:
 a support including a support surface and a support bond pad on the support surface;
 a first die including a first die surface and a first die bond pad on the first die surface, wherein the first die is disposed on the support;
 a connection coupled to the first die bond pad and the support bond pad;
 a second die spaced apart from the first die by an attachment, the second die including a second die surface and a second die bond pad on the second die surface;
 a third die spaced apart from the second die by an attachment, the third die including a third die surface and a third die bond pad on the third die surface, wherein each of the second and third dice are coupled with adhesive;
 a dielectric layer located outside the first die, the second die, and the third die, wherein the dielectric layer contacts the first die surface, the second die surface, the third die surface, and the support surface, and the dielectric layer contacts the connection coupled to the first die bond pad and the support bond pad;
 wherein the first die, the second die, and the third die include a processor, a memory device including a memory controller, and an I/O controller that includes a communication module for wireless communication.

11. The apparatus of claim 10, wherein the second die and the third die are arranged in a stack.

12. The apparatus of claim 10, wherein the memory device is selected from a dynamic random-access memory (DRAM) and a static random-access memory (SRAM), a flash memory, and a combination of these memory devices.

13. The apparatus of claim 10, wherein the communication module for wireless communication is a cellular phone.

14. The apparatus of claim 10, wherein no wires are used for connections between the first die and the support.

15. The apparatus of claim 14, wherein connections between the first die and the support are done by melting solder balls to form a conductive connection.

16. The apparatus of claim 10, the apparatus further including:
 a first connection between the second die and the support;
 a second connection in contact with the second die and coupled to the support;
 a third connection in contact with the third die and coupled to the support.

17. The apparatus of claim 10, wherein no wires are used for connections between the first die and the support, the apparatus further including:
 a connection coupled between the second die and the support;
 a second connection in contact with the second die and coupled to the support; and
 a third connection in contact with the third die and coupled to the support.

18. The apparatus of claim 10, wherein the dielectric layer covers at least a portion of the first die surface and at least a portion of the support surface.

19. The apparatus of claim 10, wherein no wires are used for connections between the first die and the support, and wherein the dielectric layer covers at least a portion of the first die surface and at least a portion of the support surface the apparatus further including:
 a connection coupled between the second die and the support;
 a second connection in contact with the second die and coupled to the support; and
 a third connection in contact with the third die and coupled to the support.

* * * * *